United States Patent
Nam et al.

(10) Patent No.: US 10,859,901 B2
(45) Date of Patent: Dec. 8, 2020

(54) PELLICLE FOR EUV LITHOGRAPHY AND METHOD OF FABRICATING THE SAME

(71) Applicant: S&S TECH Co., Ltd., Daegu-si (KR)

(72) Inventors: Kee-Soo Nam, Daegu-si (KR); Chang-Hun Lee, Daegu-si (KR); Ju-Hee Hong, Daegu-si (KR); Chul-Kyun Park, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 187 days.

(21) Appl. No.: 16/111,381

(22) Filed: Aug. 24, 2018

(65) Prior Publication Data
US 2019/0146324 A1    May 16, 2019

(30) Foreign Application Priority Data
Nov. 10, 2017    (KR) .................. 10-2017-0149847

(51) Int. Cl.
| | | |
|---|---|---|
| *G03F 1/22* | (2012.01) | |
| *G03F 1/62* | (2012.01) | |
| *G03F 1/64* | (2012.01) | |
| *G03F 1/38* | (2012.01) | |
| *G03F 7/20* | (2006.01) | |

(52) U.S. Cl.
CPC .................. *G03F 1/22* (2013.01); *G03F 1/38* (2013.01); *G03F 1/62* (2013.01); *G03F 1/64* (2013.01); *G03F 7/70983* (2013.01)

(58) Field of Classification Search
CPC .......... G03F 1/22; G03F 7/70983; G03F 1/62; G03F 1/64; G03F 1/66
See application file for complete search history.

(56) References Cited

U.S. PATENT DOCUMENTS

| 6,927,146 B2 | 8/2005 | Brask et al. |
| 2012/0045714 A1 | 2/2012 | Akiyama et al. |
| 2012/0183757 A1 | 7/2012 | Akiyama et al. |

(Continued)

FOREIGN PATENT DOCUMENTS

| JP | 2014211474 A | 11/2014 |
| JP | 2016539372 A | 12/2016 |

(Continued)

OTHER PUBLICATIONS

Japanese Office Action dated Jan. 29, 2019 issued in corresponding Japanese Patent Application No. 2018-078063, 7 pages in Japanese, with partial English translation.

(Continued)

*Primary Examiner* — Stewart A Fraser
(74) *Attorney, Agent, or Firm* — Juan Carlos A. Marquez; Marquez IP Law Office, PLLC

(57) ABSTRACT

Disclosed is a pellicle for extreme ultraviolet (EUV) lithography. The pellicle may include: a support layer pattern which is formed by etching a support layer; a pellicle layer which is formed on the support layer pattern; and an etching stop layer pattern which is formed between the support layer pattern and the pellicle layer and formed by etching an etching stop layer of stopping etching when the support layer is etched. Thus, there is provided a pellicle for EUV photomask, which maintains high transmittance with the minimum thickness for EUV exposure light, and is excellent in mechanical strength and thermal characteristics.

19 Claims, 13 Drawing Sheets

(56) References Cited

U.S. PATENT DOCUMENTS

| | | | |
|---|---|---|---|
| 2014/0370423 A1 | 12/2014 | Goldfarb | |
| 2016/0048079 A1* | 2/2016 | Lee | G03F 7/2004 |
| | | | 438/460 |
| 2016/0147141 A1 | 5/2016 | Ono et al. | |
| 2016/0313637 A1 | 10/2016 | Mathijs et al. | |
| 2016/0334698 A1 | 11/2016 | Jeon et al. | |
| 2017/0038676 A1 | 2/2017 | Jung et al. | |
| 2017/0082920 A1* | 3/2017 | Tseng | G03F 1/62 |

FOREIGN PATENT DOCUMENTS

| | | |
|---|---|---|
| KR | 10-201200083208 A | 7/2012 |
| KR | 10-10-1382414 B1 | 4/2014 |
| KR | 10-1435226 B1 | 8/2014 |
| KR | 10-1512198 B1 | 4/2015 |
| KR | 10-2015-0121293 A | 10/2015 |
| KR | 10-2016-0019755 A | 2/2016 |
| KR | 101624078 B1 | 5/2016 |
| KR | 10-2016-0133751 A | 11/2016 |
| KR | 1020170016159 A | 2/2017 |
| KR | 10-1717615 B1 | 3/2017 |
| TW | 201243491 A1 | 11/2012 |
| TW | I428690 B | 3/2014 |
| WO | 2013 152921 A1 | 10/2013 |
| WO | 2014142125 A1 | 9/2014 |
| WO | 2017012846 A1 | 1/2017 |
| WO | 2017036944 A1 | 3/2017 |

OTHER PUBLICATIONS

Extended European Search Report dated Nov. 7, 2018 issued in corresponding European Patent Application No. 18165360.1, 26 pages in English.

Taiwan Office Action dated Jan. 16, 2019 issued in corresponding Taiwan Patent Application No. 107115836, 8 pages in Chinese.

Notice of Allowance dated Aug. 30, 2018 issued in corresponding Korean Patent Application No. 10-2017-0149847, 3 pages in Korean.

Korean Office Action dated Apr. 1, 2018 in corresponding Korean patent application No. 10-2017-0149847, 6 pp.

* cited by examiner

PELLICLE FOR EUV LITHOGRAPHY AND METHOD OF FABRICATING THE SAME

CROSS-REFERENCE TO RELATED THE APPLICATION

This application claims priority from Korean Patent Application No. 10-2017-0149847 filed on Nov. 10, 2017 in the Korean Intellectual Property Office, the disclosure of which is incorporated herein by reference.

BACKGROUND

Field

The present disclosure relates to a pellicle for extreme ultraviolet (EUV) lithography and a method of fabricating the same, and more particularly to a pellicle for EUV lithography, which has high transmittance to EUV exposure light and is improved in mechanical strength, and a method of fabricating the same.

Description of the Related Art

Development of exposure technology called photolithography has made it possible for a semiconductor integrated circuit (IC) to have high integration. To form a finer circuit pattern on a wafer, resolution (also referred to as a limit of resolution) in exposure equipment has to become higher. When a fine pattern beyond the limit of resolution is transferred, there is a problem that a distorted image different from an original mask pattern is transferred because of light interference caused by diffraction and scattering.

A currently commercialized exposure process employs exposure equipment using an ArF wavelength range of 193 nm to perform a transfer process and form a fine pattern on a wafer, but is limited in terms of forming a fine pattern of 32 nm or less. Accordingly, there have been developed various methods such as immersion lithography of using a liquid medium having a higher refractive index (e.g. 1.44) than air; double lithography of performing exposure twice; phase shift technology of shifting a phase of light by 180 degrees and causing a destructive interference with adjacent transmission light; optical phase correction of correcting a small size or rounded end of a designed pattern caused by the interference and diffraction of light; etc. However, the exposure technology using the ArF wavelength is not only difficult to get a finer circuit line width narrower than or equal to 32 nm, but also increases production costs and process complexity. Therefore, extreme ultraviolet (EUV) photolithography technology, in which a wavelength of 13.5 nm very shorter than the wavelength of 193 nm is used for a main exposure wavelength, has attracted attention as the next-generation process.

By the way, the lithography process employs a photomask as an original plate for patterning, and a pattern on the photomask is transferred to a wafer. In this case, if the photomask is attached with impurities such as particles, foreign materials, etc., the impurities may damage the pattern transferred after absorbing or reflecting the exposure light and thus causes performance or yield of the semiconductor device.

To prevent the surface of the photomask from being attached with impurities, a method of attaching a pellicle to the photomask is being used. The pellicle is attached to the top surface of the photomask, and therefore dust or foreign materials on the pellicle are out of focus and not transferred to the pattern since the pattern of the photomask is in focus at a photolithography process even though impurities are attached to the pellicle. With recent fineness of the circuit line width, the size of impurities that may have an effect on the damage of the pattern is decreased, thereby increasing importance of the pellicle for protecting the photomask.

When the pellicle is provided as a single film using a material having a low extinction coefficient with regard to EUV light of 13.5 nm, it is easy to guarantee transmittance but very difficult to secure good mechanical and thermal characteristics. Accordingly, a multi-layered pellicle has been researched to complement the performance of the pellicle.

The pellicle is configured to include a pellicle layer in the form of an extremely thin film basically having a thickness of 100 nm or less for smooth and excellent transmittance of the EUV exposure light. The pellicle layer has to satisfy mechanical reliability with regard to vacuum environments and acceleration of a moving stage, and thermal reliability with regard to a long-term exposure process. Taking these conditions into account, the material and structure of the pellicle layer are determined.

SUMMARY

Accordingly, an aspect of one or more exemplary embodiments may provide a pellicle for an EUV photomask, which is excellent in transmittance with regard to EUV exposure light and mechanical strength.

According to one embodiment of the present disclosure, a pellicle for extreme ultraviolet (EUV) lithography includes: a support layer pattern which is formed by etching a support layer; a pellicle layer which is formed on the support layer pattern; and an etching stop layer pattern which is formed between the support layer pattern and the pellicle layer and formed by etching an etching stop layer of stopping etching when the support layer is etched.

The pellicle layer includes a core layer, and one or more reinforcing layers formed on at least one among both surfaces of the core layer and different in material from the core layer.

The core layer may include: one or more materials among boron (B), phosphorus (P), arsenic (As), yttrium (Y), zirconium (Zr), niobium (Nb) and molybdenum (Mo) in addition to a monocrystalline, amorphous or polycrystalline silicon layer; or one or more metal silicide materials among molybdenum silicide (MoSi), tungsten silicide (WSi), zirconium silicide (ZrSi) and tantalum silicide (TaSi).

The core layer may have a thickness of 100 nm or less.

The reinforcing layer may include: a silicon compound including one or more among carbon (C), nitrogen (N), oxygen (O) in addition to silicon (Si); or one or more materials among silicon carbide (SiC), boron carbide ($B_4C$), ruthenium (Ru), molybdenum (Mo), graphene, and a carbon nano tube (CNT).

The reinforcing layer may be different in material from the core layer and the etching stop layer pattern, and have a thickness of 2~10 nm and a tensile stress of 50~150 MPa.

The etching stop layer pattern may include a silicon compound including one or more among carbon (C), nitrogen (N), oxygen (O) in addition to silicon (Si). The etching stop layer pattern may have a thickness of 10~500 nm. The etching stop layer pattern may include silicon oxide having a compression stress lower than or equal to 300 Mpa.

The pellicle may further include an auxiliary reinforcing layer additionally formed on an outer surface of at least one reinforcing layer.

The auxiliary reinforcing layer may include: a silicon compound including one or more among carbon (C), nitrogen (N), oxygen (O) in addition to silicon (Si); or one or more materials among silicon carbide (SiC), boron carbide ($B_4C$), ruthenium (Ru), molybdenum (Mo), graphene, and a carbon nano tube (CNT).

The auxiliary reinforcing layer may be different in material from the core layer and the reinforcing layer, and have a thickness of 2~10 nm.

When the etching stop layer includes oxygen (O), tetramethylammonium hydroxide (TMAH) may be used for etching the support layer to form the support layer pattern.

The pellicle may further include an etching mask layer formed on an outer surface of the reinforcing layer, and including a silicon compound including oxygen (O) in addition to silicon (Si).

The silicon compound of the etching mask may include at least one of carbon (c) and nitrogen (N), or one or more metal materials among chrome, gold and aluminum.

The reinforcing layer may include an outer porous surface having nano-sized pores.

The porous surface of the reinforcing layer may be formed by making the core layer have a porous surface.

The porous surface of the core layer may be formed by dry etching, and the dry etching may be performed using $XeF_2$ and $N_2$ gas.

The porous surface may have a roughness of 1~10 nm.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Figure 1:
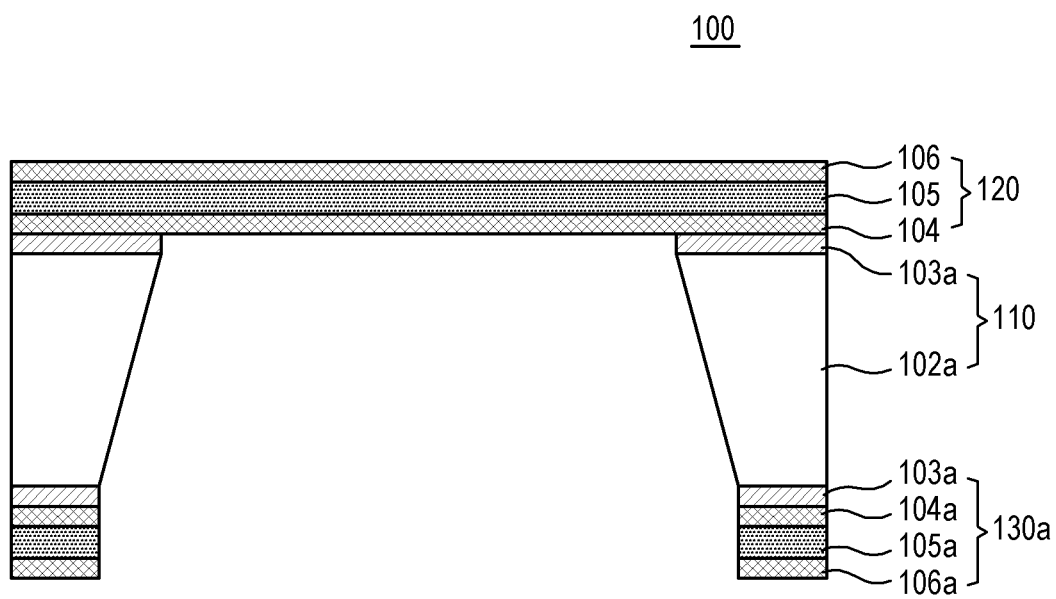
FIG. 1 is a cross-section view of a pellicle for extreme ultraviolet lithography according to a first embodiment of the present disclosure.

FIG. 1 is a cross-section view of a pellicle for extreme ultraviolet (EUV) photomask according to a first embodiment of the present disclosure.

Referring to FIG. 1, a pellicle 100 for an EUV photomask includes a frame layer 110, and a pellicle layer 120 formed above the frame layer 110. The frame layer 110 includes an upper support layer pattern 102a and an upper etching stop layer pattern 103a. The pellicle layer 120 includes a lower reinforcing layer 104, a core layer 105 and an upper reinforcing layer 106.

The support layer pattern 102a supports the pellicle layer 110, and facilitating easily handling and transferring when the pellicle is completely manufactured. The support layer pattern 102a is made of a material to be etched by a dry/wet etching process. For example, the support layer pattern 102a may be formed by applying microfabrication technology to quartz, a silicon-on-insulator (SOI), or a silicon (Si) wafer.

The support layer pattern 102a may be made of the silicon (Si) wafer that has a crystalline orientation of [100]; a doping density of $10^{20}$ ions/cm$^2$; various sizes of 6 inch, 8 inch, etc.; and a thickness of 400 μm~800 μm to be readily formed to have a desired shape when the support layer 102 of FIG. 3 is patterned by the wet etching process.

The etching stop layer pattern 103a is buried between the support layer pattern 102a and the pellicle layer 120, and includes a silicon (Si) compound that contains one or more among carbon (C), nitrogen (N) and oxygen (O) in addition to silicon (Si) excellent in etching selectivity with the support layer 102 when the etching stop layer 103 of FIG. 3 is subjected to the dry/wet etching process. The etching stop layer pattern 102a is made of a material different from those of the lower reinforcing layer 104 and the core layer 105, and has a thickness of 10~500 nm.

As a layer for reinforcing the mechanical strength and thermal characteristics of the core layer 105, the upper and lower reinforcing layers 104 and 106 may be respectively formed on both surfaces of the core layer 105, or only one of the upper and lower reinforcing layers 104 and 106 may be formed on one side of the core layer 105. The upper and lower reinforcing layers 104 and 106 have high transmittance and protect the pellicle layer 120 from high temperature of the EUV process. The upper and lower reinforcing layers 104 and 106 include the silicon compound that contains one or more among carbon (C), nitrogen (N), oxygen (O) in addition to silicon (Si), or one or more materials among silicon carbide (SiC), boron carbide ($B_4C$), ruthenium (Ru), molybdenum (Mo), graphene, a carbon nano tube (CNT), which are different in materials from those of the etching stop layer 102 and the core layer 105, and each has a thickness of 2~10 nm.

Here, the upper and lower reinforcing layers 104 and 106 may be deteriorated in strength when they each has a thickness of 2 nm or less, and may be remarkably decreased in transmittance of EUV exposure light and not usable when they each has a thickness of 10 nm or more. Therefore, the upper and lower reinforcing layers 104 and 106 are formed to each has an optimum thickness in consideration of the overall transmittance and mechanical strength of the pellicle.

The core layer 105 is materialized by a monocrystalline, amorphous or polycrystalline silicon layer excellent in transmittance, which may additionally contain one or more materials among boron (B), phosphorus (P), arsenic (As), yttrium (Y), zirconium (Zr), niobium (Nb) and molybdenum (Mo); or one or more metal silicide materials among molybdenum silicide (MoSi), tungsten silicide (WSi), zirconium silicide (ZrSi), tantalum silicide (TaSi), etc. Further, the core layer 105 may be different in materials from the etching stop layer pattern 103a and the upper and lower reinforcing layers 104 and 106. The core layer 105 may have a thickness of 100 nm or less, and have a transmittance of 80% or higher with regard to the EUV exposure light having a wavelength of 13.5 nm.

The EUV is well absorbed in any materials, and has strong thermal energy with a short wavelength. Therefore, it is very important to dissipate heat from the pellicle layer. By the way, a conventional method of solving a heat dissipation problem lays emphasis on finding a material having a good heat-dissipation coefficient. However, according to the present disclosure, increase in a surface area is also taken into account in addition to selection of a material excellent in the heat-dissipation coefficient. To this end, a nano-pore is formed on the surface of the core layer 105 to thereby maximize the surface area and increase a heat-dissipation effect.

That is, according to the present disclosure, the surface of the core layer 105 is subjected to surface treatment to complement the thermal characteristics of. the core layer 105. That is, the surface of the core layer 105 is formed with nano-sized fine pores, and thus an outer surface of the upper reinforcing layer 106 formed thereon is a porous surface. With this, the outer surface of the upper reinforcing layer 106 is increased in area, thereby increasing a heat-dissipation effect. To make the upper reinforcing layer 106 have the porous surface, the upper reinforcing layer 106 itself may be etched. However, in terms of the properties of the material, when the porous surface is formed by etching, it is more effective to etch the core layer 105 rather than the upper reinforcing layer 106.

Figure 4:
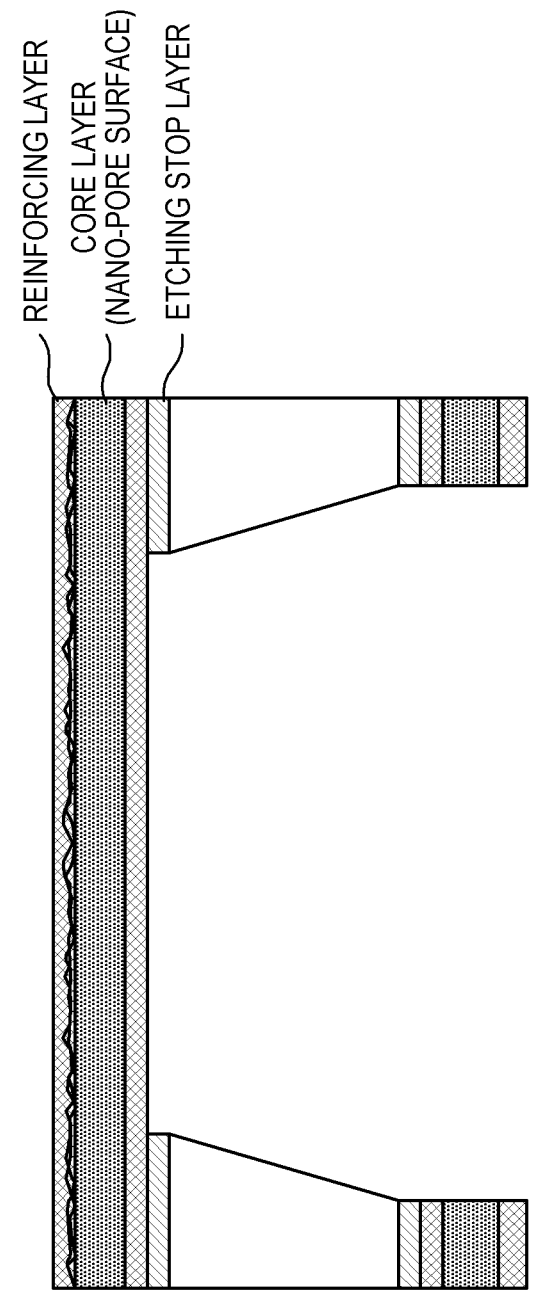
FIG. 4 is a schematic view of illustrating that a nano core is formed in a core layer according to the first embodiment shown in FIG. 1.
Figure 5:
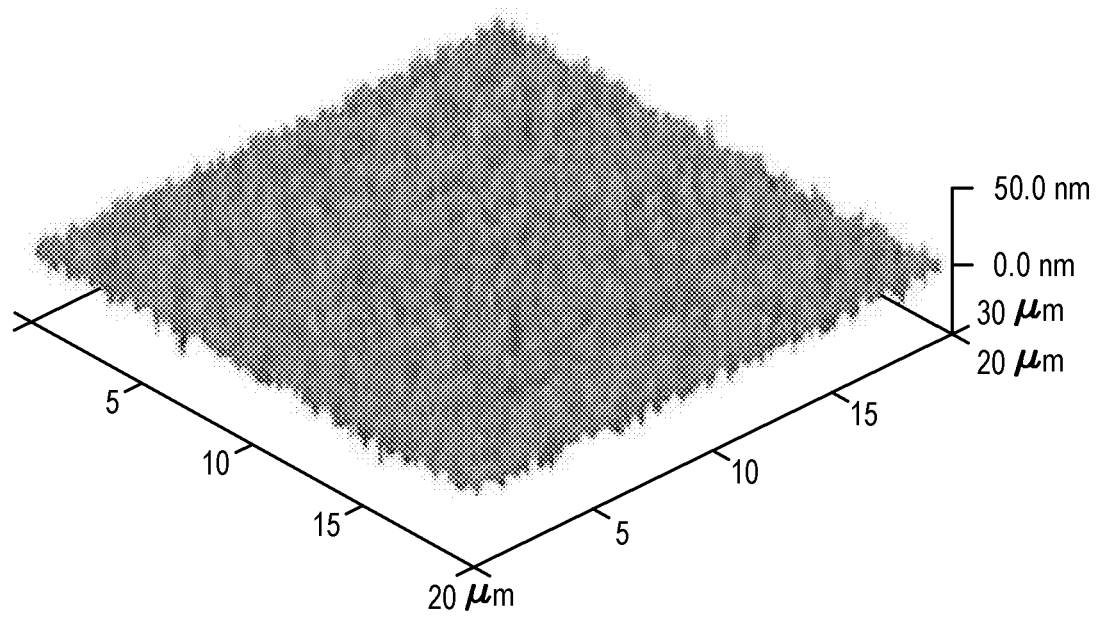
FIG. 5 is a view of illustrating the nano core represented in a portion of the core layer in FIG. 4.

In this case, the surface has a roughness of 1~10 nm (see FIGS. 4 and 5). When the surface of the core layer 105 has the foregoing roughness, the surface of the reinforcing layer 106 also has the same roughness. Preferably, the surface roughness ranges from 3 to 5 nm. When the surface roughness is of several nano meters, the surface of the layer has little influence on transmittance uniformity of the EUV light. When the surface roughness is higher than several nano meters, the transmittance uniformity is deteriorated. That is, the surface roughness of 1~10 nm is preferable to increase the bight-dissipation effect while preventing light from scattering due to a nano structure.

In this embodiment, a lower thin-film layer pattern 130a including multi-layered patterns 103a, 104a, 105a, 106a is provided beneath the frame layer 110, and the lower thin-film layer pattern 130a is formed when the pellicle 100 of FIG. 1 is fabricated. In this regard, descriptions will be made with reference to FIG. 3.

Figure 2:
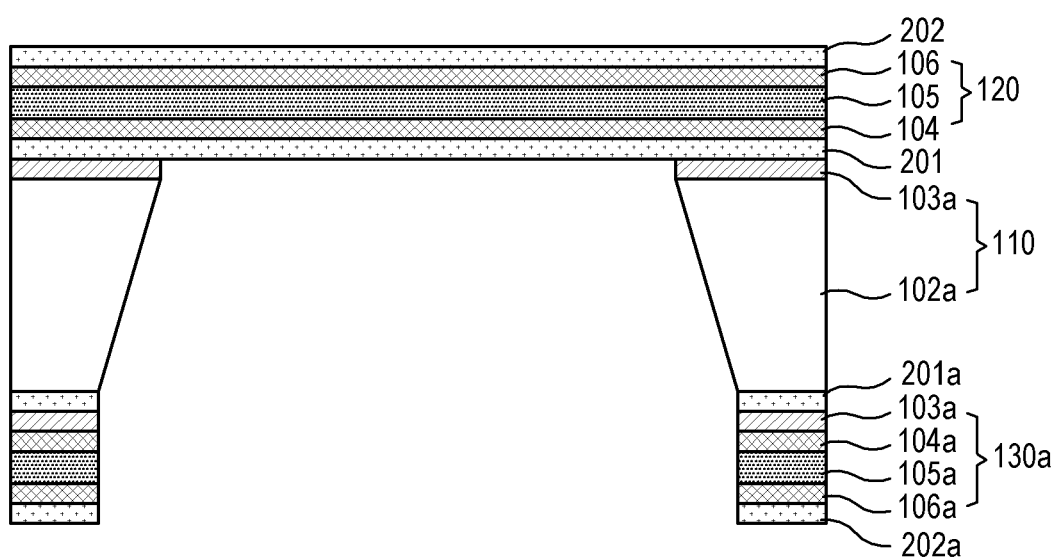
FIG. 2 is a cross-section view of a pellicle for extreme ultraviolet lithography according to a second embodiment of the present disclosure.

FIG. 2 is a cross-section view of a pellicle for EUV lithography according to a second embodiment of the present disclosure. In this embodiment, detailed descriptions will be avoided and the same reference numerals will be given with regard to substantially the same elements as that of the embodiment illustrated in FIG. 1.

Referring to FIG. 2, the pellicle for EUV lithography according to the second embodiment of the present disclosure is the same as that of the foregoing first embodiment in light of including the frame layer 110 having the support layer pattern 102a and the etching stop layer pattern 103a, and the pellicle layer 120 having the frame layer 110, the lower reinforcing layer 104, the core layer 105 and the upper reinforcing layer 106. The pellicle according to this embodiment additionally includes auxiliary reinforcing layers 201 and 202 formed on both surfaces or either surface of the pellicle layer 120.

In this embodiment, the lower thin-film layer pattern 130a with multi-layered patterns 201a, 103a, 104a, 105a, 106a and 202a is provided beneath the frame layer 110. The lower thin-film layer pattern 130a is formed by processes similar to those of FIG. 3 (to be described) when the pellicle of FIG. 2 is fabricated, and thus detailed descriptions thereof will be avoided.

The auxiliary reinforcing layers 201 and 202 includes a silicon (Si) compound that contains one or more among carbon (C), nitrogen (N) and oxygen (O) in addition to silicon (Si); or one or more materials among silicon carbide (SiC), boron carbide ($B_4C$), ruthenium (Ru), molybdenum (Mo), graphene, and a carbon nano tube (CNT), which are different in material from the etching stop layer pattern 103a, the core layer 105 and the reinforcing layers 104 and 106, and each has a thickness of 2~10 nm.

Like that of the first embodiment, the surface of the core layer 105 is subjected to surface treatment to improve thermal characteristics, and formed with nano-sized fine pores. Likewise, the surface roughness may also range from 1 to 10 nm.

According to this embodiment, when the auxiliary reinforcing layers 201 and 202 are additionally provided, the auxiliary reinforcing layer may be made of a metallic material to thereby improve heat-dissipation characteristics.

FIGS. 3A to 3I are views of sequentially illustrating a method of fabricating the pellicle for the EUV lithography according to the first embodiment shown in FIG. 1.

Figure 3A:
FIGS. 3A to 3I are views of sequentially illustrating a method of fabricating the pellicle for the extreme ultraviolet lithography according to the first embodiment shown in FIG. 1.

First, as shown in FIG. 3A, the support layer 102 is prepared to be used as a base for fabricating the pellicle for the EUV photomask according to the present disclosure.

Figure 3B:
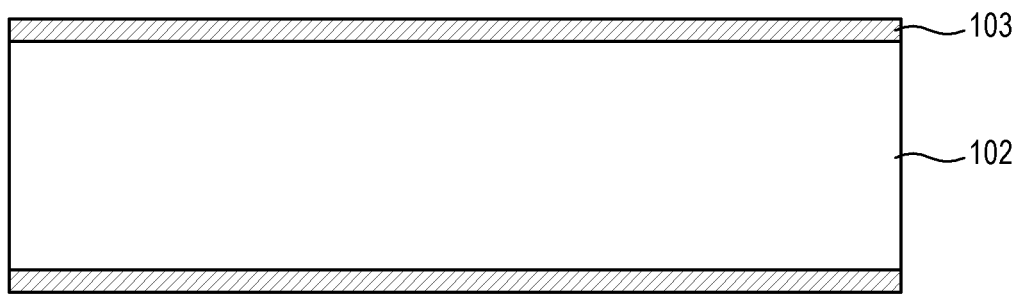

Referring to FIG. 3B, the etching stop layer 103 including a silicon (Si) compound that contains one or more among oxygen (O), nitrogen (N) and carbon (C) in addition to silicon (Si) is formed on a top surface of the support layer 102 by chemical vapor deposition (CVD), a thermal oxidation process, sputtering, atomic layer deposition (ALD), etc. In this case, the same layer as the etching stop layer 103 is formed on a bottom surface of the support layer 102.

It is advantageous that the etching stop layer 103 is made of a material having high etching selectivity with the support layer 102 for the etching process. Therefore, the etching selectivity may be equal to or higher than 104 so that the etching stop layer 103 can have a sufficient wet etching selectivity against the support layer 102. Further, the etching stop layer 103 may have the minimum residual stress to prevent the pellicle layer 120 from being broken while the pellicle is fabricated. Thus, the etching stop layer 103 is formed including silicon oxide having a compression stress lower than or equal to 300 Mpa.

Figure 3C:
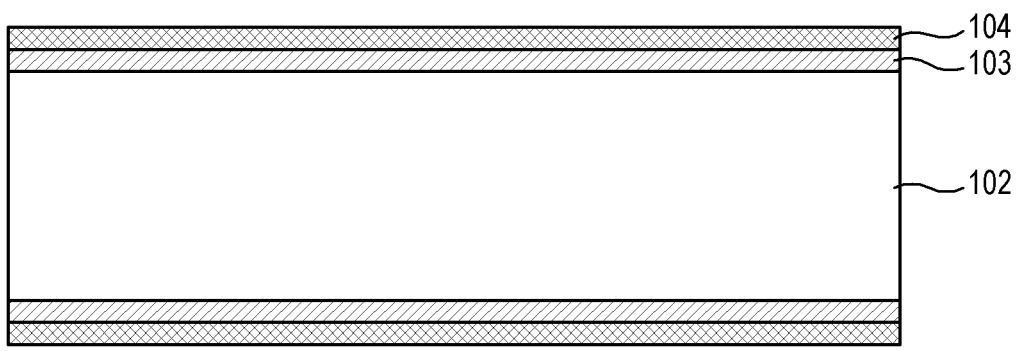

Referring to FIG. 3C, the lower reinforcing layer 104 is formed on the top surface of the upper etching stop layer 103 by CVD, sputtering, ALD, etc. In this case, the same layer as the lower reinforcing layer 104 is also formed on the bottom surface of the lower etching stop layer 103.

The lower reinforcing layer 104 may be formed to have a tensile stress of 50~150 Mpa for an anti-wrinkle surface of the pellicle layer 120. Therefore, the lower reinforcing layer 104 according to the present disclosure may be made of silicon nitride excellent in not only mechanical strength and chemical durability but also step coverage.

Figure 3D:
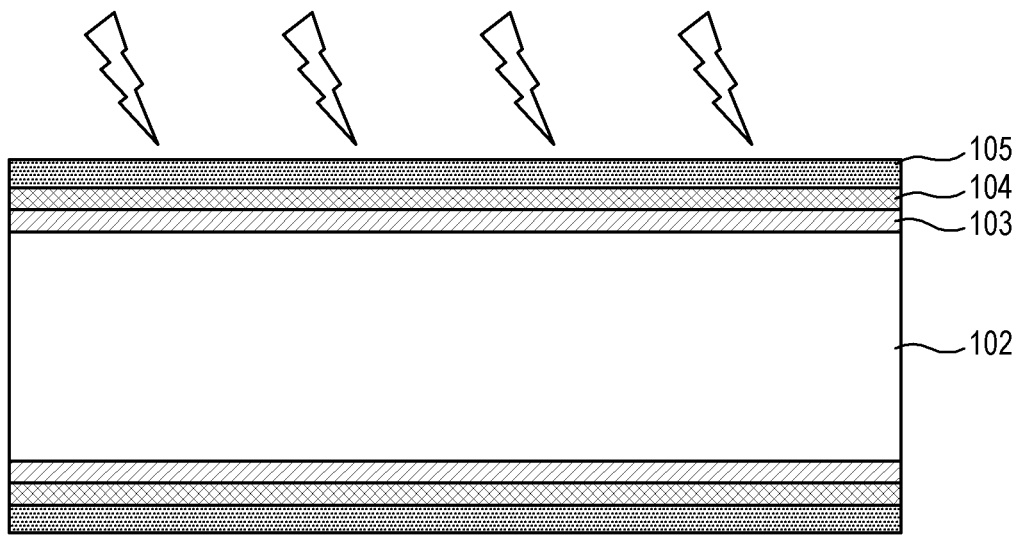

Referring to FIG. 3D, the core layer 105 is formed on the top surface of the upper lower reinforcing layer 104 by epitaxial growth, CVD, Sputtering, etc. In this case, the same layer as the core layer 105 is also formed on the bottom surface of the lower reinforcing layer 104.

According to the present disclosure, the core layer 105 may be made of polycrystalline silicon advantageous to a microfabrication process and excellent in optical, thermal and mechanical characteristics. Further, as described above, the surface of the core layer 105 is fabricated to have nano-sized porosity to improve thermal characteristics of the core layer 105. To form fine pores on the surface, a dry etching method and a wet etching method are possible. In this embodiment, the dry etching method may be used since the wet etching method is difficult to make the surface roughness be lower than or equal to 10 nm, and the higher roughness causes the transmittance uniformity to be decreased with regard to the EUV light. Preferably, a nano-porous structure may be fabricated using $XeF_2$ gas of 25 sccm and $N_2$ gas of 100 sccm, and the process is performed for a short period of time of several seconds since polycrystalline silicon is quickly etched.

Figure 3E:
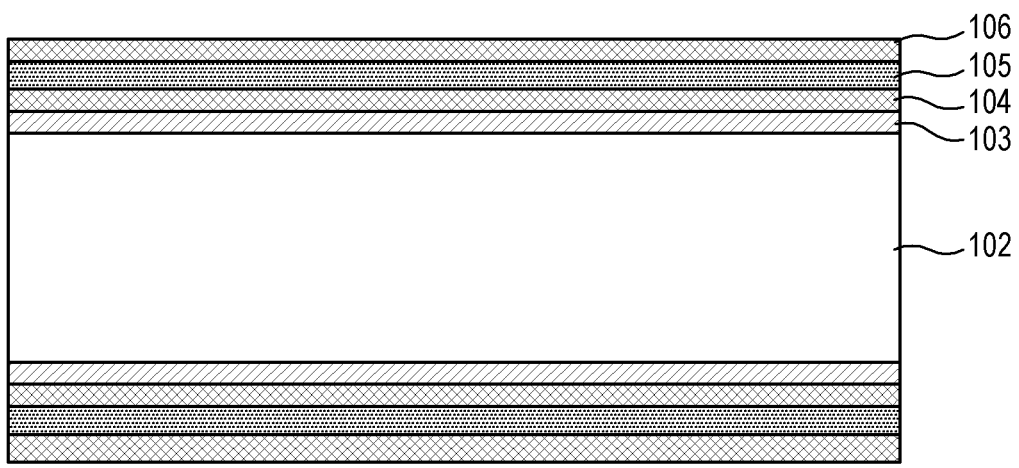

Referring to FIG. 3E, the upper reinforcing layer 106 is deposited on the top surface of the upper core layer 105, and at the same time the same layer as the upper reinforcing layer 106 is formed on the bottom surface of the lower core layer 105. In this case, the upper reinforcing layer 106 is formed by the same method as that of forming the foregoing lower reinforcing layer 104.

Figure 3F:

Referring to FIG. 3F, the etching mask layer 107 is formed on the outer surfaces of the upper reinforcing layers 106 on the upper side and the lower side by thermal oxidation process, CVD, sputtering, ALD, Etc.

An etching mask layer 107 is made of a material having high etching selectivity against the support layer 102 and easily removable after etching the support layer 102, and includes a silicon compound that contains one or more among carbon (C), nitrogen (N) and oxygen (O) in addition to silicon (Si), or one or more materials among chrome, gold, aluminum and the like metal. According to the present disclosure, the etching mask layer 107 may use a silicon oxide film that is excellent in step coverage and thin-film density and causes relatively few or no surface defects. The etching mask layer 107 is formed to have at least a thickness of 100 nm in consideration of the process of etching the support layer 102 with regard to the whole thickness. During the etching, the reinforcing layer 106 or the auxiliary reinforcing layer is partially etched and it may be thus difficult to accurately maintain the thickness. To prevent this, the etching mask layer 107 is laid on the top surface of the reinforcing layer 106 or the auxiliary reinforcing layer, thereby protecting the surfaces of the reinforcing layer and the auxiliary reinforcing layer and controlling the accurate thickness thereof.

Figure 3G:
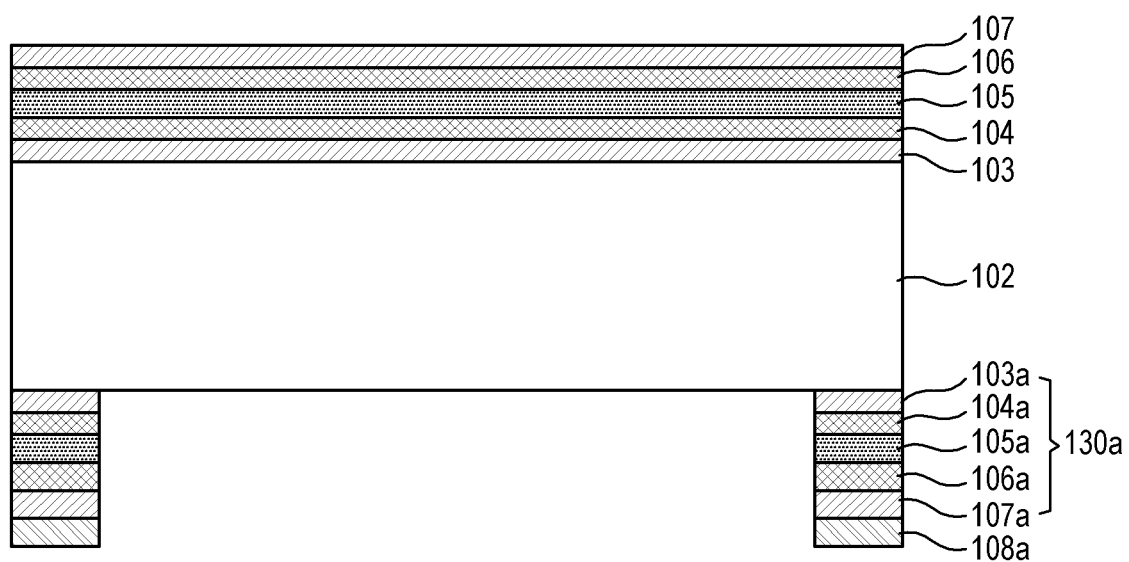

Referring to FIG. 3G, a photoresist film pattern 108a is formed on a bottom surface of a substrate, and the photoresist film pattern 108a is used as an etching mask to sequentially etch the etching mask layer 107, the upper reinforcing layer 106, the core layer 105, the lower reinforcing layer 104 and the etching stop layer 103 below the support layer 102 through the dry or wet etching process, thereby forming the lower thin-film layer pattern 130a through which the support layer 102 is exposed. In this case, the dry etching process resulting in a good etching profile is used.

Figure 3H:
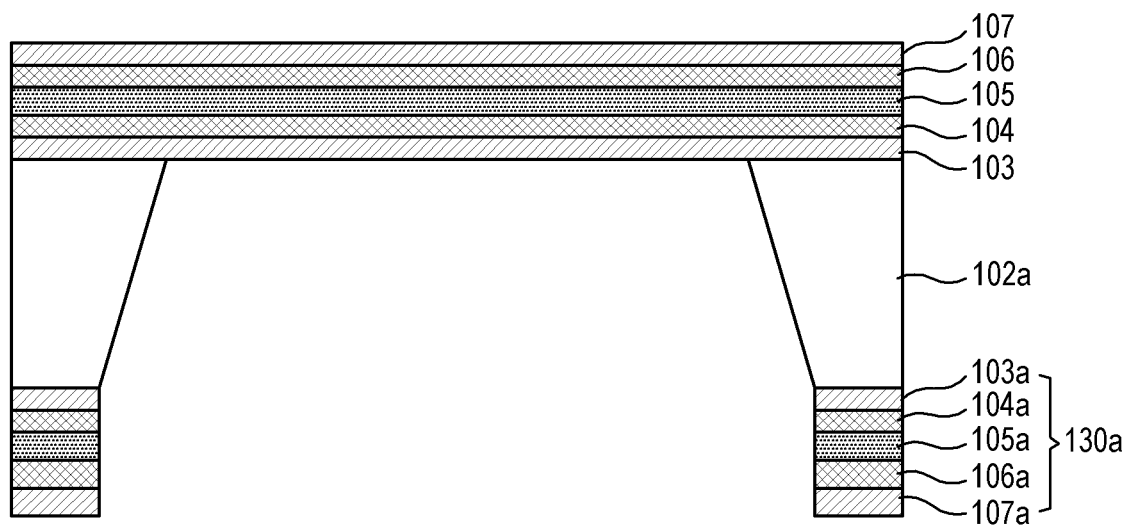

Referring to FIG. 3H, after removing the photoresist film pattern 108a, the support layer 102 is etched by the dry etching process using a deep etcher, a XeF$_2$ etcher or the like, or by the wet etching process using potassium hydroxide (KOH), tetramethylammonium hydroxide (TMAH) or the like, thereby forming the support layer pattern 102a through which the etching stop layer 103 is exposed.

According to the present disclosure, TMAH having a very high etching selectivity of 104 or higher with the lower thin-film layer pattern 130a is used for etching the support layer 102. Further, when the etching stop layer 103 includes oxygen (O), it is preferable that TMAH is used for etching the support layer 102. As described above, the etching mask layer 107 may be made of a silicon compound that contains one or more among oxygen, carbon and nitrogen in addition to silicon. In particular, when the etching mask layer 107 includes oxygen (O), TMAH is used as an etchant more suitable for etching the support layer 102.

By the way, to reduce the surface defects such as the roughness, hillocks and the like of the etched surface when the support layer 102 is etched for forming the support layer pattern 102a, a surfactant such as isopropyl alcohol (IPA), triton X-100, etc. may be added.

Figure 3I:
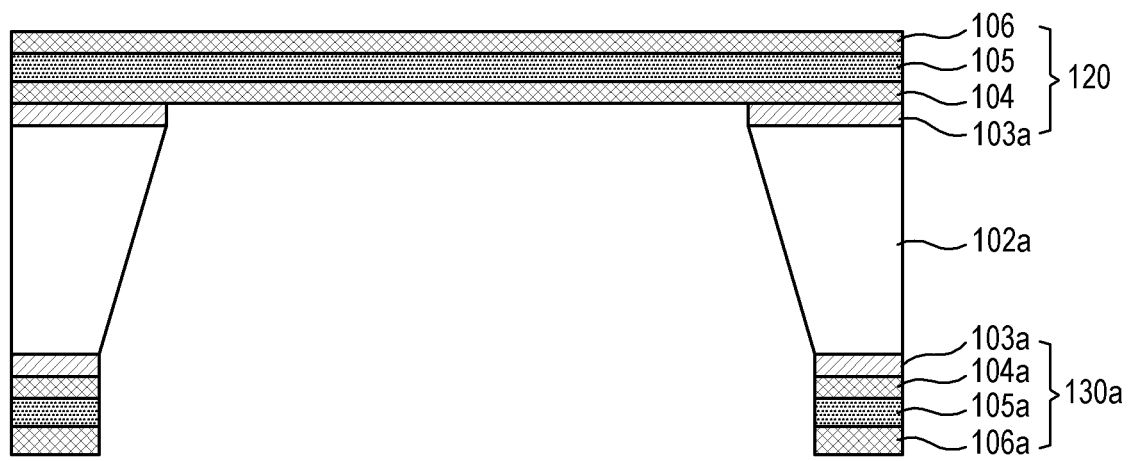

Referring to FIG. 3I, the etching stop layer pattern 103a is formed to expose the lower reinforcing layer 104 through the dry or wet etching process, and the etching mask layer 107 is removed to thereby complete the fabrication of the pellicle for the EUV lithography according to an embodiment of the present disclosure. The etching mask layer 107 may be removed at the same time when the etching stop layer 103 is etched. To this end, the etching stop layer 103 and the etching mask layer 107 may be made of materials to be etched by the same etchant.

When the etching mask layer 107 is removed, an alkali etching solution remaining on the surface of the pellicle layer 130 is completely removed using desalted water, and then the etching stop layer 103 and the etching mask layer 107 are etched and removed. In this embodiment, hydrogen fluoride (HF) may be used to etch and remove both the etching stop layer 103 and the etching mask layer 107.

According to the present disclosure, the etching stop layer 103 is provided between the support layer 102 and the pellicle layer 120, and therefore the pellicle layer 120 is prevented from being unintentionally damaged by an etchant for the support layer 102 when the support layer pattern 102a is etched by etching the support layer 102. In particular, the pellicle layer 120 or the lower reinforcing layer 104 or the lower auxiliary reinforcing layer 201 is very much thinner than the support layer 102 in the pellicle, and therefore these layers generally including SiN may be damaged by unintentional etching even though the etching selectivity is very high with regard to the support layer 102. Accordingly, it is possible to prevent such damage when the etching stop layer 103 is present according to the present disclosure.

As described above, according to an exemplary embodiment of the present disclosure, it is possible to provide a pellicle for an EUV photomask, which is excellent in mechanical strength and thermal conductivity while maintaining high transmittance for EUV exposure light with the minimum thickness.

Although a few exemplary embodiments of the present disclosure have been shown and described in details with reference to the accompanying drawings, the embodiments are given for only illustrative purposes without limiting the meaning and scope of the present disclosure defined in the appended claims. Therefore, it will be appreciated by a person having an ordinary skill in the art that various changes and equivalents may be made in these exemplary embodiments. Thus, the scope of the present disclosure has to be defined by technical matters of the appended claims.

What is claimed is:

1. A pellicle for extreme ultraviolet (EUV) lithography, the pellicle comprising:
   a support layer pattern which is formed by etching a support layer;
   a pellicle layer which is formed on the support layer pattern; and
   an etching stop layer pattern which is formed between the support layer pattern and the pellicle layer and formed by etching an etching stop layer for stopping an etching of the support layer when the support layer is etched,
   wherein the pellicle layer comprises a core layer, and one or more reinforcing layers formed on at least one of both surfaces of the core layer and different in material from the core layer, and
   wherein the reinforcing layer comprises an outer porous surface having nano-sized pores.

2. The pellicle according to claim 1, wherein the core layer comprises:
   one or more materials among boron (B), phosphorus (P), arsenic (As), yttrium (Y), zirconium (Zr), niobium (Nb) and molybdenum (Mo) in addition to a monocrystalline, amorphous, or polycrystalline silicon layer; or
   one or more metal silicide materials among molybdenum silicide (MoSi), tungsten silicide (WSi), zirconium silicide (ZrSi) and tantalum silicide (TaSi).

3. The pellicle according to claim 1, wherein the core layer has a thickness of 100 nm or less.

4. The pellicle according to claim 1, wherein the reinforcing layer comprises:
   a silicon compound comprising one or more among carbon (C), nitrogen (N), oxygen (O) in addition to silicon (Si); or
   one or more materials among silicon carbide (SiC), boron carbide ($B_4C$), ruthenium (Ru), molybdenum (Mo), graphene, and a carbon nano tube (CNT).

5. The pellicle according to claim 1, wherein the reinforcing layer is different in material from the core layer and the etching stop layer pattern, and has a thickness of 2~10 nm.

6. The pellicle according to claim 1, wherein the reinforcing layer has a tensile stress of 50~150 MPa.

7. The pellicle according to claim 1, wherein the etching stop layer pattern comprises a silicon compound comprising one or more among carbon (C), nitrogen (N), oxygen (O) in addition to silicon (Si).

8. The pellicle according to claim 7, wherein the etching stop layer pattern has a thickness of 10~500 nm.

9. The pellicle according to claim 1, wherein the etching stop layer pattern comprises silicon oxide having a compression stress lower than or equal to 300 Mpa.

10. The pellicle according to claim 1, further comprising an auxiliary reinforcing layer additionally formed on an outer surface of at least one reinforcing layer.

11. The pellicle according to claim 10, wherein the auxiliary reinforcing layer comprises:
    a silicon compound comprising one or more among carbon (C), nitrogen (N), oxygen (O) in addition to silicon (Si); or
    one or more materials among silicon carbide (SiC), boron carbide ($B_4C$), ruthenium (Ru), molybdenum (Mo), graphene, and a carbon nano tube (CNT).

12. The pellicle according to claim 10, wherein the auxiliary reinforcing layer is different in material from the core layer and the reinforcing layer, and has a thickness of 2~10 nm.

13. The pellicle according to claim 1, wherein, when the etching stop layer comprises oxygen (O), tetramethylammonium hydroxide (TMAH) is used for etching the support layer to form the support layer pattern.

14. The pellicle according to claim 13, further comprising an etching mask layer formed on an outer surface of the reinforcing layer, and comprising a silicon compound comprising oxygen (O) in addition to silicon (Si).

15. The pellicle according to claim 14, wherein the silicon compound of the etching mask comprises at least one of carbon (c) and nitrogen (N), or one or more metal materials among chrome, gold and aluminum.

16. The pellicle according to claim 1, wherein the porous surface of the reinforcing layer is formed by making the core layer have a porous surface.

17. The pellicle according to claim 16, wherein the porous surface of the core layer is formed by dry etching.

18. The pellicle according to claim 17, wherein the dry etching is performed using $XeF_2$ and $N_2$ gas.

19. The pellicle according to claim 1, wherein the porous surface has a roughness of 1~10 nm.

* * * * *